United States Patent
Hanada et al.

(10) Patent No.: US 7,532,076 B2
(45) Date of Patent: May 12, 2009

(54) OPERATIONAL AMPLIFIER

(75) Inventors: Kouichi Hanada, Kyoto (JP); Masanori Kayama, Kyoto (JP); Naohiro Nomura, Kyoto (JP); Akira Noguchi, Kyoto (JP)

(73) Assignee: Rohm Co., Ltd. (JP)

( * ) Notice: Subject to any disclaimer, the term of this patent is extended or adjusted under 35 U.S.C. 154(b) by 88 days.

(21) Appl. No.: 11/665,212

(22) PCT Filed: Sep. 29, 2005

(86) PCT No.: PCT/JP2005/017984

§ 371 (c)(1),
(2), (4) Date: Apr. 12, 2007

(87) PCT Pub. No.: WO2006/040935

PCT Pub. Date: Apr. 20, 2006

(65) Prior Publication Data

US 2008/0012641 A1    Jan. 17, 2008

(30) Foreign Application Priority Data

Oct. 15, 2004   (JP) .............................. 2004-300998

(51) Int. Cl.
 *H03F 1/52* (2006.01)
 *H03F 3/45* (2006.01)
(52) U.S. Cl. ...................................... 330/298; 330/252
(58) Field of Classification Search .............. 330/207 P, 330/298
See application file for complete search history.

(56) References Cited

U.S. PATENT DOCUMENTS

| 4,044,313 | A | * | 8/1977 | Wittlinger et al. ......... 330/207 P |
| 4,126,830 | A | * | 11/1978 | Schade, Jr. .................. 330/277 |
| 6,507,471 | B2 | * | 1/2003 | Colclaser et al. ............ 361/111 |

FOREIGN PATENT DOCUMENTS

CN        1351378        5/2002

(Continued)

OTHER PUBLICATIONS

Notification of Reason(s) for Refusal for Japanese Patent Application No. 2004-300998 dated Dec. 6, 2005.
International Search Report for International Application No. PCT/JP2005/017984 dated Nov. 15, 2005.

(Continued)

*Primary Examiner*—Steven J Mottola
(74) *Attorney, Agent, or Firm*—Cantor Colburn LLP (57) ABSTRACT

An operational amplifier includes a differential amplifier circuit provided at an input stage and an amplifier circuit at a post stage. In the differential amplifier circuit, first and third bipolar transistors are PNP-type bipolar transistors and Darlington-connected. An inverting input terminal is connected to the base terminal of the first bipolar transistor. The first and third bipolar transistors and second and fourth bipolar transistors construct an input differential pair. First and second protection diodes are connected between the base terminals of the first and second bipolar transistors constructing the input differential pair and the ground potential, respectively. Each of the protection diodes is connected so that the cathode terminal is positioned on the base terminal side of the bipolar transistor, and the cathode terminal is positioned on the ground potential side.

6 Claims, 4 Drawing Sheets

FOREIGN PATENT DOCUMENTS

| | | |
|---|---|---|
| JP | S60-155213 | 10/1985 |
| JP | 62-291175 | 12/1987 |
| JP | 63-24674 | 2/1988 |
| JP | 6-237124 | 8/1994 |
| JP | 11-74742 | 3/1999 |
| JP | 2002-141421 | 5/2002 |

OTHER PUBLICATIONS

International Preliminary Report on Patentability for International Application No. PCT/JP2005/017984 dated Apr. 17, 2007.
Chinese Office Action for Chinese Application No. 200580033827.1 issued Sep. 19, 2008 with English Translation.

* cited by examiner

OPERATIONAL AMPLIFIER

CROSS REFERENCE TO RELATED APPLICATIONS

This is a U.S. national stage of application No. PCT/JP2005/017984, filed on 29 Sep. 2005. Priority under 35 U.S.C. §119(a) and 35 U.S.C. §365(b) is claimed from Japanese Application No. 2004-300998, filed 15 Oct. 2004, the disclosure of which is also incorporated herein by reference.

BACKGROUND OF THE INVENTION

1. Field of the Invention

The present invention relates to an operational amplifier and, particularly, to a circuit protection technique for the same.

2. Description of the Related Art

An operational amplifier is widely used for various purposes as a basic circuit in an electronic circuit. Such an operational amplifier is needed not only in the case where it is integrated as part of an LSI for use but also in many purposes as a single package product mounted on a print board.

A package product of such a circuit part is strongly requested to have reliability against surge, static electricity, and the like. In the case where an operational amplifier is formed as a single package product, an inverting input terminal and a non-inverting input terminal are led out as external electrodes, so that it is necessary to provide a protection circuit for the input terminals.

The inverting and non-inverting input terminals of an operational amplifier are connected to transistors constructing an input differential pair, and have to be protected against an electro static discharge (hereinbelow, abbreviated as ESD) and the like. Protection of an operational amplifier is described in, for example, Patent Document 1.

[Patent Document 1] Japanese Patent Application Laid-Open No. 11-74742.

In the technique described in the above document, a method of improving breakdown voltage by using bipolar transistors as transistors constructing the input differential pair is employed. However, even when bipolar transistors are used, when a high voltage of hundreds V to a few kV is applied across a base and an emitter or across a base and a collector, there is a case that the reliability of the technique is affected.

SUMMARY OF THE INVENTION

The present invention has been achieved in view of such a problem and a general purpose of the invention is to provide an operational amplifier having high breakdown voltage.

An embodiment of the present invention relates to an operational amplifier. The operational amplifier includes a protection diode whose cathode terminal is connected to a control terminal of at least one of transistors constructing an input differential pair connected to an inverting input terminal and a non-inverting input terminal and whose anode terminal is connected to a ground potential terminal.

The "control terminal" refers to the base terminal in a bipolar transistor and a gate terminal in a field effect transistor (hereinbelow, abbreviated as FET).

In this embodiment, by providing the protection diode between the inverting/non-inverting input terminal and the ground potential as a fixed potential, before a surge current flows in the transistors constructing the differential pair, the protection diode is turned on in the opposite direction, and a voltage applied to the transistor is clamped. Thus, the breakdown voltage can be increased.

The "operational amplifier" in the specification has a wide concept including a comparator having an input differential pair.

The transistors constructing the input differential pair may be PNP-type bipolar transistors, and the size of the protection diode may be set so that reverse current flowing from the cathode terminal to the anode terminal becomes substantially equal to the base current of the transistors.

By using the bipolar transistors, the breakdown voltage can be made higher than that in the case of using FETs. Further, by passing the base current of the bipolar transistors to the ground by utilizing the reverse current of the diode, the influence of the base current on circuits connected to the input terminal of the operational amplifier can be reduced.

Another embodiment of the present invention also relates to an operational amplifier. This operational amplifier includes a protection diode whose anode terminal is connected to a control terminal of at least one of transistors constructing an input differential pair connected to an inverting input terminal and a non-inverting input terminal and whose cathode terminal is connected to a power supply voltage terminal as a fixed potential.

In this embodiment, also in the case where a surge voltage is applied to the power supply voltage terminal or the inverting/non-inverting input terminal, transistors can be protected.

The transistors constructing the input differential pair may be NPN-type bipolar transistors, and the size of the protection diode may be set so that reverse current flowing from the cathode terminal to the anode terminal becomes substantially equal to the base current of the transistors.

By using the bipolar transistors, the breakdown voltage can be made higher than that in the case of using FETs. Further, by supplying the base current of the bipolar transistors via the protection diode by utilizing the reverse current of the protection diode, the influence of the base current on circuits connected to the input terminal of the operational amplifier can be reduced.

A plurality of protection diodes may be connected in parallel.

By forming a plurality of diodes in parallel so that the area can be adjusted by trimming, in the case where the breakdown voltage of a transistor changes due to variations in the semiconductor manufacturing process and the like, the size of the protection diodes can be adjusted in accordance with the breakdown voltage of the transistor. Further, in the case where the current amplification factor of a transistor varies due to variations in the semiconductor manufacturing process and the like, the bias current of the operational amplifier, that is, the base current of the transistors constructing the input differential pair varies. Consequently, by adjusting the size of the protection diode in accordance with the base current, the influence on circuits connected to the input terminal can be reduced.

The operational amplifier is integrated, and the protection diode may be provided adjacent to an electrode pad corresponding to the inverting input terminal or the non-inverting input terminal to which the protection diode is connected.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
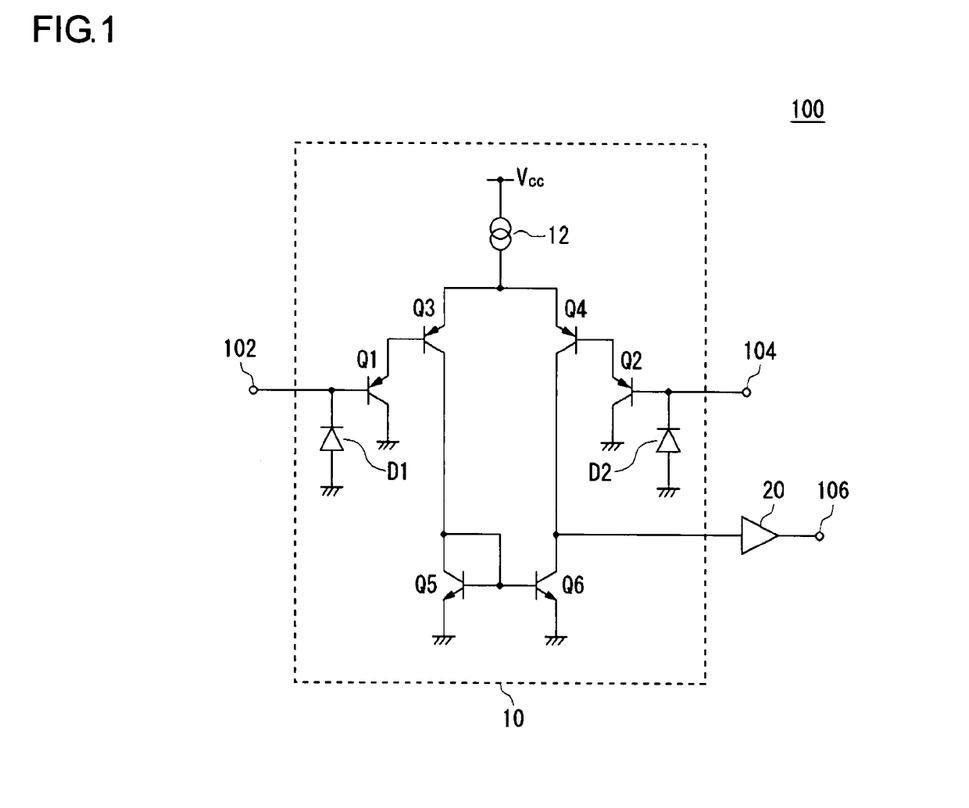
FIG. 1 is a circuit diagram showing the configuration of an operational amplifier according to an embodiment.

FIG. 1 is a circuit diagram showing the configuration of an operational amplifier 100 according to an embodiment. The operational amplifier 100 includes a differential amplifier circuit 10 provided at an input stage and an amplifier circuit 20 at a post stage. The operational amplifier 100 performs differential amplification on signals which are input to an inverting input terminal 102 and a non-inverting input terminal 104 and outputs from an output terminal 106. In the subsequent diagrams, the same reference numerals are designated to the same elements and repetitive description will not be given.

The differential amplifier circuit 10 includes first to sixth bipolar transistors Q1 to Q6, a constant current source 12, and first and second protection diodes D1 and D2.

The first bipolar transistor Q1 and the third bipolar transistor Q3 are PNP-type bipolar transistors and are Darlington-connected. The inverting input terminal 102 is connected to the base terminal of the first bipolar transistor Q1.

Similarly, the second bipolar transistor Q2 and the fourth bipolar transistor Q4 are also PNP-type bipolar transistors and are Darlington-connected. The non-inverting input terminal 104 is connected to the base terminal of the second bipolar transistor Q2.

The first and third bipolar transistors Q1 and Q3 and the second and fourth bipolar transistors Q2 and Q4 construct an input differential pair in the differential amplifier circuit 10. The emitter terminals of the third and fourth bipolar transistors Q3 and Q4 are commonly connected to the constant current source 12.

The fifth and sixth bipolar transistors Q5 and Q6 are NPN-type bipolar transistors and base and emitter terminals are commonly connected, thereby forming a current mirror circuit. The fifth and sixth bipolar transistors Q5 and Q6 function as constant current loads for the first and third bipolar transistors Q1 and Q3 and the second and fourth bipolar transistors Q2 and Q4 constructing the input differential pair.

In the operational amplifier 100 according to the embodiment, the first and second protection diodes D1 and D2 are connected between the base terminals of the first and second bipolar transistors Q1 and Q2 constructing the input differential pair and the ground potential, respectively. The protection diodes are connected so that the cathode terminal is on the base terminal side of the bipolar transistor, and the anode terminal is on the ground potential side.

The connection point between the fourth and sixth bipolar transistors Q4 and Q6 is connected to the amplifier circuit 20. The amplifier circuit 20 may have any circuit form as long as it forms an output stage of a general operational amplifier.

A circuit protection for the operational amplifier 100 constructed as described above will be described. When a surge voltage of hundreds V to a few kV is supplied from the inverting input terminal 102 or the non-inverting input terminal 104, the first and second diodes D1 and D2 are turned on in different directions. At this time, large current flows in the opposite directions in the first and second protection diodes D1 and D2, and the potential difference between the anode and the cathode is clamped at a Zener voltage Vz. As a result, a voltage equal to or higher than the Zener voltage Vz is not applied between the base and the emitter of each of the first and second bipolar transistors Q1 and Q2. Consequently, by setting the Zener voltage Vz of the protection diode to be lower than breakdown voltage between the base and the emitter or the base and the collector of the bipolar transistor, application of a high voltage influencing on the reliability of the bipolar transistor can be prevented.

The size of the protection diode in the operational amplifier 100 according to the embodiment will now be described.

In the third and fourth bipolar transistors Q3 and Q4 forming the differential pair in the differential amplifier circuit 10, bias current flows from the constant current source 12. The relation of $Ic=Ib\times\beta$ is satisfied using the current amplification factor $\beta$ between the base current Ib and the collector current Ic of the bipolar transistors.

When it is assumed that current of $2\times Ix$ is generated by the constant current source 12, collector current of Ix flows in the third and fourth bipolar transistors Q3 and Q4 at the time of balance. Therefore, current of $Ix/\beta$ flows as the base current of the third and fourth bipolar transistors Q3 and Q4.

Since the first to fourth transistors Q1 to Q4 constructing the differential pair are formed close to each other in a single integrated circuit, it is considered that their current amplification factors $\beta$ are equal to each other. Since the base currents of the third and fourth bipolar transistors Q3 and Q4 correspond to the collector currents of the first and second bipolar transistors Q1 and Q2 which are Darlington-connected, the base current of the first and second bipolar transistors Q1 and Q2 is given by $Ix/(\beta\times\beta)$.

The base current of the first and second bipolar transistors Q1 and Q2 flows from the inverting input terminal 102 and the non-inverting input terminal 104 to the outside of the operational amplifier 100. Generally, the output impedance of circuits connected to the inverting input terminal 102 and the non-inverting input terminal 104 of the operational amplifier 100 is sufficiently lower than the input impedance of the operational amplifier 100, so that the influence of the base current on the circuit operation does not become a problem. When an element for outputting a detection current corresponding to an input signal such as a photodiode is connected to the inverting input terminal 102 or the non-inverting input terminal 104 in the operational amplifier 100 and the detection current is weak, however, there is a case that the influence of the base current flowing in the first and second bipolar transistors Q1 and Q2 on the circuit operation is unignorable.

In such a case, it is desirable to determine the size of the protection diode for the operational amplifier 100 in the embodiment as follows.

In the case where the voltage applied in the opposite directions to the diodes provided as the first and second protection diodes D1 and D2 is lower than the Zener voltage Vz, a weak reverse current flows from the cathode terminal to the anode terminal in each of the diodes. The reverse current flowing in the protection diode is proportional to the size of the diode.

Consequently, the size of the diode is adjusted to make the reverse current flowing in the protection diode substantially equal to the base current flowing in the first and second bipolar transistors Q1 and Q2 when balanced, so that the base current flowing in the first and second bipolar transistors Q1 and Q2 flows to the ground via the first and second protection diodes D1 and D2. As a result, no current flows from the inverting input terminal 102 and the non-inverting input terminal 104 to the outside, so that the influence on circuits connected to the outside can be reduced. Although how far the base current of the bipolar transistor and the reverse current of the protection diode need to be equalized may be determined in accordance with a circuit connected on the outside, desirably, one of the currents may be set to be in the range from at least half to double the other of the currents.

Figure 2:
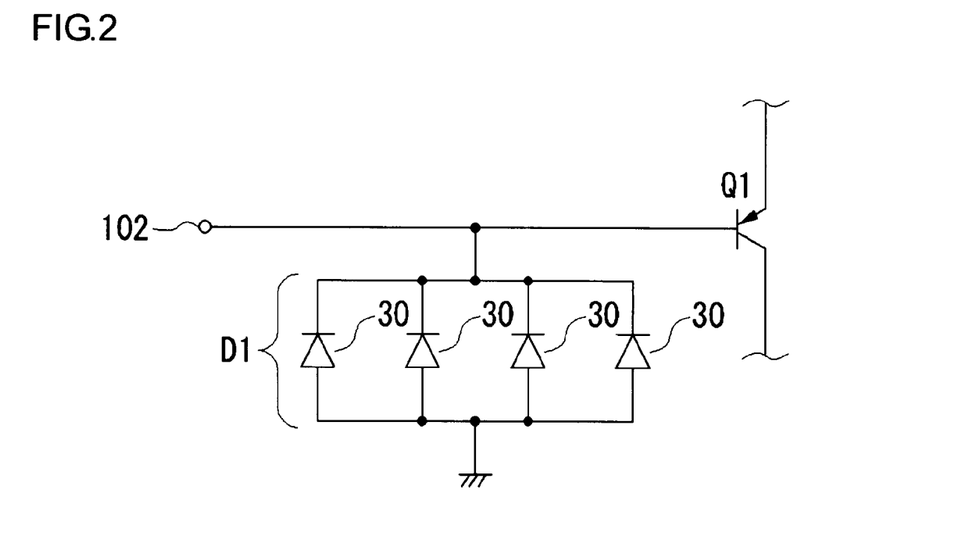
FIG. 2 is a diagram showing peripheral circuits of an inverting input terminal in the operational amplifier of FIG. 1.

The first and second protection diodes D1 and D2 may be formed by connecting a plurality of diodes in parallel. FIG. 2 shows peripheral circuits of the inverting input unit 102 in the operational amplifier 100 of FIG. 1.

In FIG. 2, the first protection diode D1 is formed by connecting four diodes 30 in parallel. Each of the diodes 30 is connected via wires. Wires connecting the diodes are cut by laser trimming to change the number of diodes connected in parallel, thereby enabling the size of the first protection diode D1 to be adjusted.

The size of the protection diode has to be adjusted for following reasons or the like. First, the breakdown voltage of the bipolar transistor to be protected changes due to variations in a semiconductor manufacturing process for producing the operational amplifier 100 and the like. On the other hand, the protectability of the protection diode is determined not only by the Zener voltage Vz of the diode but also by the size of the diode. Consequently, by trimming the wires connecting the diodes 30 in accordance with the breakdown voltage of the bipolar transistor to obtain a desired size, the bipolar transistor to be protected can be properly protected.

In the case where the current amplification factor β of the bipolar transistor varies due to variations in the semiconductor manufacturing process or the like, the bias current of the operational amplifier 100, that is, the base current of the first and second bipolar transistors Q1 and Q2 constructing the input differential pair also varies. Therefore, in the case where the influence of the base current on circuits connected to the inverting input terminal 102 and the non-inverting input terminal 104 of the operational amplifier 100 has to be reduced, the size of the first and second protection diodes D1 and D2 can be adjusted by trimming so that the base current and the reverse current become equal to each other.

In designing of a semiconductor integrated circuit, there is a case that the same mask is desired to be used commonly for a plurality of products. For example, there is a case such that when a property such as slew rate required for the operational amplifier 100 varies among products, the bias current, that is, the base current of the first and second bipolar transistors Q1 and Q2 may be changed in accordance therewith. In this case, by forming products so that the diode size can be adjusted by trimming, the property can be adapted to a plurality of products without largely changing the designs.

Figure 3A:
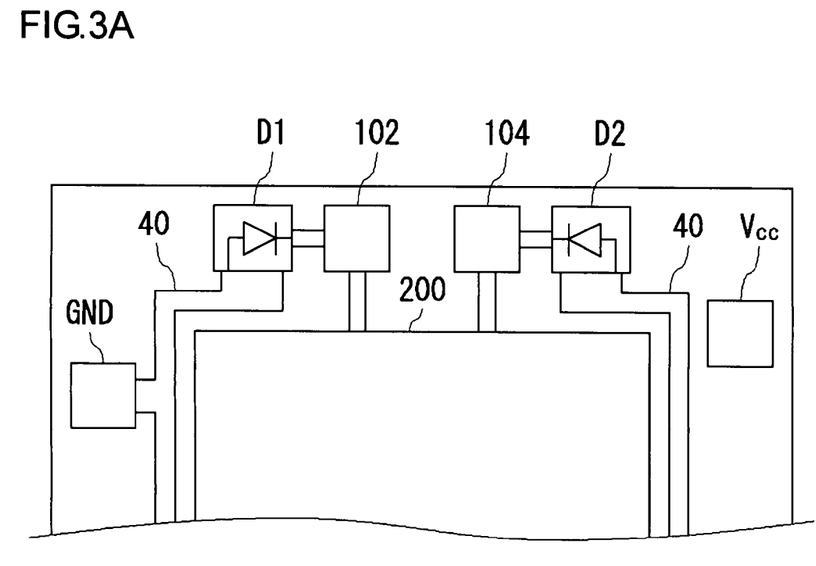
FIGS. 3A and 3B are diagrams showing arrangement on a semiconductor chip of electrode pads of inserting and non-inverting input terminals and first and second protection diodes of the operational amplifier of FIG. 1.
Figure 3B:
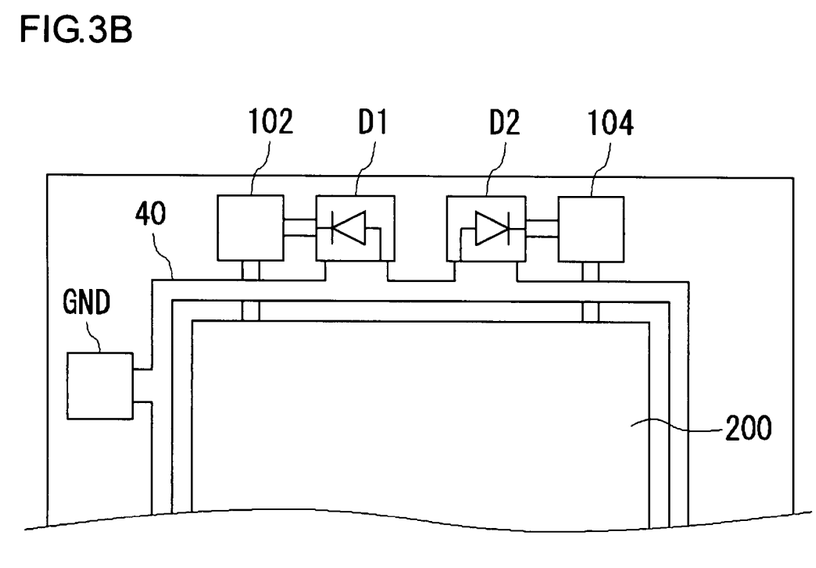

FIGS. 3A and 3B are diagrams showing the layout on a semiconductor chip of electrode pads of the inverting input terminal 102 and the non-inverting input terminal 104 of the operational amplifier 100 of FIG. 1 and the first and second protection diodes D1 and D2. As shown in FIGS. 3A and 3B, bipolar transistors constructing the operational amplifier 100 are formed in a center area 200 on the semiconductor chip.

At the periphery of the semiconductor chip, electrode pads of the inverting input terminal 102, the non-inverting input terminal 104, a ground terminal GND, a power supply voltage terminal Vcc, and the like are disposed so as to surround the area 200.

The size of the protection diode is almost the same as that of the electrode pad. Consequently, the protection diodes are disposed in line with the electrode pads at the periphery of the semiconductor chip. That is, the first and second protection diodes D1 and D2 are provided so as to be adjacent to the electrode pads of the inverting input terminal 102 and the non-inverting input terminal 104.

When a surge voltage is applied to the inverting input terminal 102 and the non-inverting input terminal 104 and the protection diode is turned on in the reverse direction, large current flows in the protection diode. Consequently, the ground potential to which the anode terminal of the protection diode is connected is connected to the ground terminal GND via a thick grounding line 40 as shown in FIGS. 3A and 3B. The grounding line 40 is laid so as to surround the area 200. By surrounding the circuit elements of the operational amplifier 100 by the grounding line 40, noises from the outside and the like are eliminated, so that the operation of the operational amplifier 100 can be further stabilized.

In the case of disposing the inverting input terminal 102 and the non-inverting input terminal 104 so as to be adjacent to each other as shown in FIG. 3A, the first to fourth bipolar transistors Q1 to Q4 constructing the differential pair are disposed so as to be adjacent to each other, so that the laid wire can be made the shortest.

In the case where the inverting input terminal 102 and the non-inverting input terminal 104 are disposed as shown in FIG. 3B, the first and second protection diodes D1 and D2 are adjacent to each other, so that the properties of the diodes can be made uniform. The interference of signals between the inverting input terminal 102 and the non-inverting input terminal 104 can be reduced.

As described above, by the operational amplifier 100 of the embodiment, the first and second bipolar transistors Q1 and Q2 constructing the input differential pair can be protected by the protection diodes. Further, by adjusting the size of the protection diode, the influence on the outside of the operational amplifier 100 of the base current flowing in the first and second bipolar transistors Q1 and Q2 can be reduced.

Figure 4:
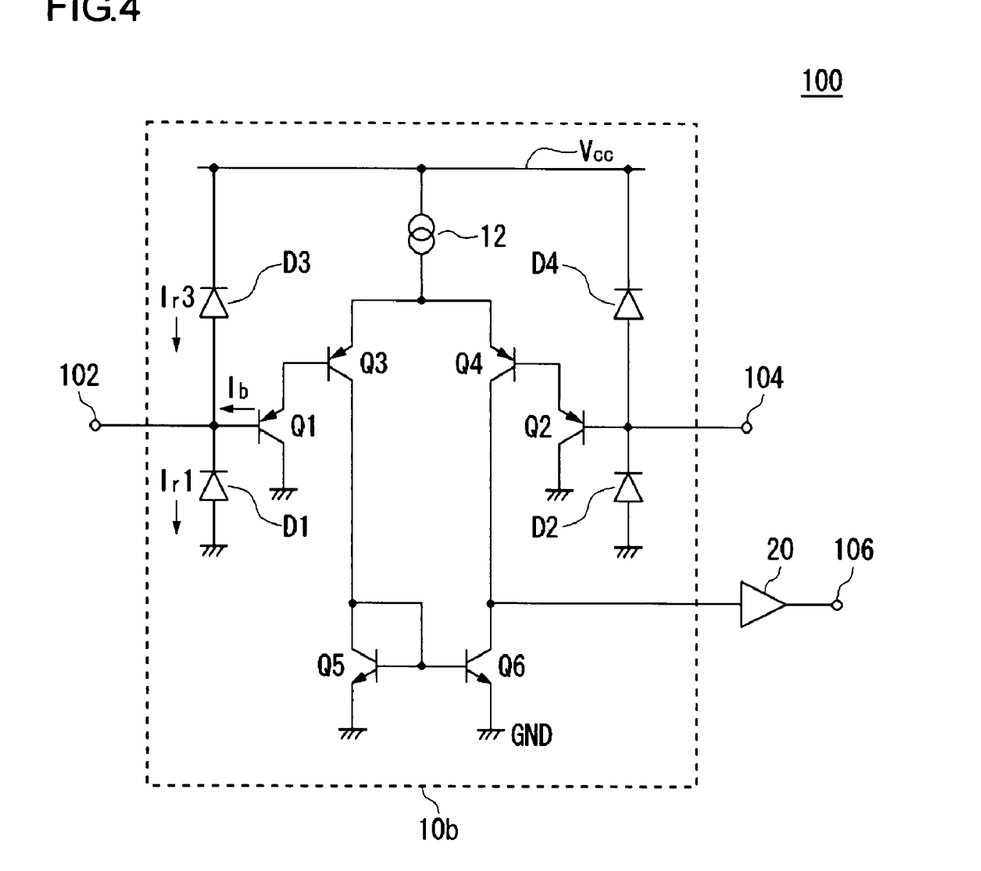
FIG. 4 is a diagram showing a modification of the configuration of a differential amplifier circuit.

The connection form of the protection diodes in the differential amplifier circuit 10 can be variously modified. FIG. 4 shows a modification of the configuration of the differential amplifier circuit 10. A differential amplifier circuit 10b shown in FIG. 4 is constructed by the same circuit elements as those of the differential amplifier circuit 10 shown in FIG. 1 but connection of the protection diodes is different.

Specifically, in the differential amplifier circuit 10b of FIG. 4, the first and second bipolar transistors Q1 and Q2 constructing the differential amplifier pair have third and fourth protection diodes D3 and D4, respectively, between their base terminals and the power supply voltage terminal Vcc.

By providing the third and fourth protection diodes D3 and D4 also between the base terminals of the bipolar transistors and the power supply voltage, in the case where a surge voltage is applied to the power supply voltage terminal Vcc, in the case where a negative surge voltage is applied to the inverting input terminal 102 and the non-inverting input terminal 104, and the like, the protection diodes are turned on in opposite directions and are clamped at the Zener voltage Vz. Consequently application of a voltage equal to or higher than the breakdown voltage to the first to fourth bipolar transistors Q1 to Q4 can be prevented, and the reliability of the circuit can be further increased.

When the differential amplifier circuit 10b of FIG. 4 performs normal operation, very small reverse current Ir1 flows from the cathode terminal to the anode terminal in the first protection diode D1, that is, from the inverting input terminal 102 toward the ground terminal GND. Similarly, also in the third protection diode D3, very small reverse current Ir3 flows from the power supply voltage terminal Vcc toward the inverting input terminal 102. The magnitude of the reverse current of each of the protection diodes is almost proportional to the size of the diode.

Therefore, when the base current of the first bipolar transistor Q1 is Ib and the sizes of the first and third protection diodes D1 and D3 are set so that Ib=Ir1−Ir3 is satisfied, the influence of the bias current on a circuit connected to the inverting input terminal 102 of the operating amplifier 100 can be reduced. The non-inverting input terminal 104 side is similar to the above.

Figure 5:
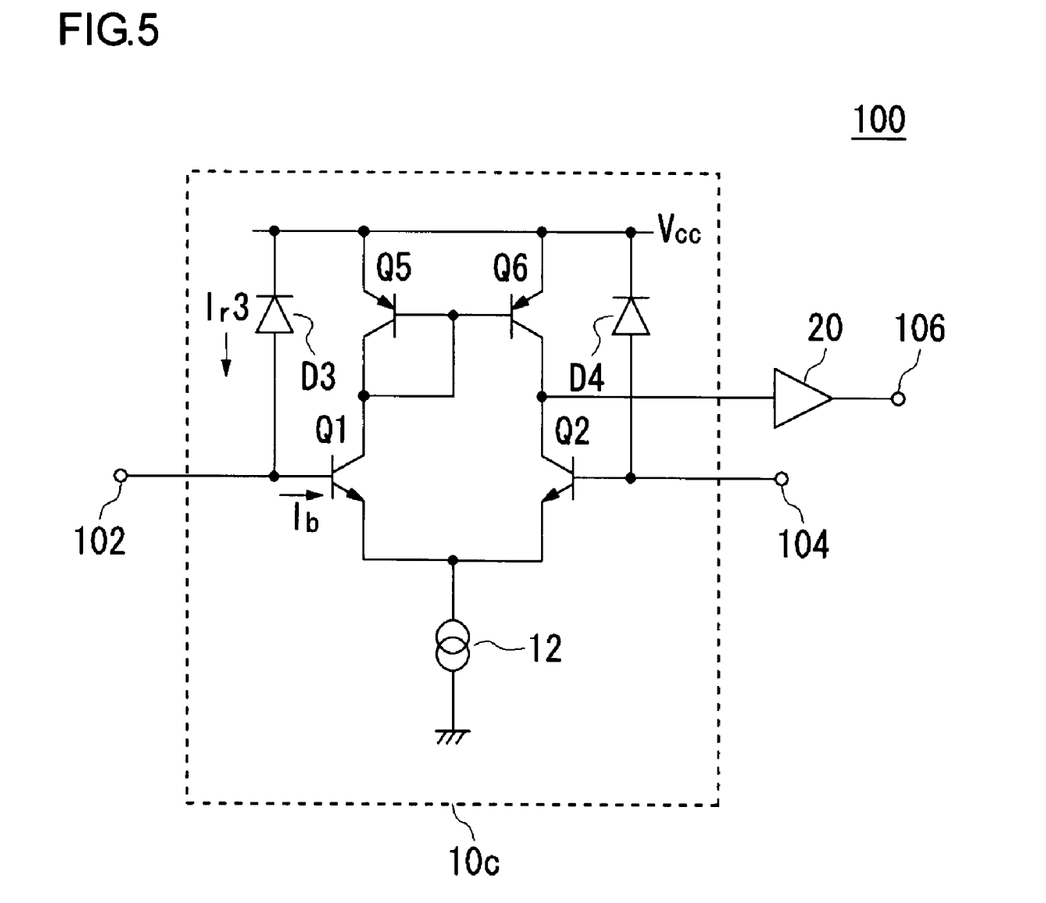
FIG. 5 is a diagram showing a modification of the differential amplifier circuit and a connection form of the protection diode.

FIG. 5 shows another modification of the connection form of the differential amplifier circuit and the protection diode. Although an input differential pair is formed by PNP-type bipolar transistors in each of the differential amplifier circuits 10 in FIGS. 1 and 4, in a differential amplifier circuit 10c of FIG. 5, an input differential pair is formed by NPN-type bipolar transistors. In an NPN-type bipolar transistor, the base current Ib flows in the direction of a transistor. Consequently, the third protection diode D3 is provided between the inverting input terminal 102 and the power supply voltage terminal Vcc. The bipolar transistors constructing the input differential pair do not always have to be Darlington-connected but may have a one-stage configuration as shown in FIG. 5.

As a result, in the case where a surge voltage is applied to the power supply voltage terminal Vcc, in the case where a negative surge voltage is applied to the inverting input terminal 102 and the non-inverting input terminal 104, and the like, the third and fourth protection diodes D3 and D4 are turned on in opposite directions and are clamped at the Zener voltage Vz. Consequently application of a voltage equal to or higher than the breakdown voltage to the first and second bipolar transistors Q1 and Q2 can be prevented, and the reliability of the circuit can be further increased.

At this time, by adjusting the size of the third protection diode D3 to set so that the reverse current Ir3 flowing in the third protection diode D3 and the base current Ib of the first bipolar transistor Q1 become substantially equal to each other, the influence of the bias current on a circuit connected to the inverting input terminal 102 of the operating amplifier 100 can be reduced. The non-inverting input terminal 104 side is similar to the above.

It is to be understood by a person skilled in the art that the foregoing embodiment is illustrative and the combinations of the components and processes can be variously modified, and such modifications are within the scope of the present invention.

Although the case where bipolar transistors are used as the transistor elements constructing the operational amplifier 100 has been described as an example, the transistor elements may be FETs. Transistors may be selected in accordance with the semiconductor manufacturing process, the requested properties, cost, and the like.

The circuit configurations of the differential amplifier circuit 10 and the connection forms of the diodes shown in FIGS. 1, 4, and 5 can be variously modified. For example, it is not always necessary to provide protection diodes for both of the inverting input terminal 102 and the non-inverting input terminal 104. A protection diode may be provided for only one of input terminals. In FIG. 4, only the first and third protection diodes D1 and D3 may be provided.

In FIG. 5, it is also possible to provide a protection diode between the base terminal of each of the first and second bipolar transistors Q1 and Q2 and the ground terminal. It is possible to Darlington-connect another transistor to each of the first and second bipolar transistors Q1 and Q2 in FIG. 5, provide a protection diode between the base terminal of each of the first and second bipolar transistors Q1 and Q2 and the ground terminal, or further provide a protection diode between the base terminal of each of the transistors and the power supply voltage terminal. The input differential pair in FIGS. 1 and 4 is not limited to the Darlington form but may have a one-stage configuration, and a protection diode may be provided between the base of each of the third and fourth bipolar transistors Q3 and Q4 and the fixed potential.

Further, in the differential amplifier circuits 10 in FIGS. 1, 4, and 5, a protection resistor may be connected to an anode terminal or cathode terminal of each of the protection diodes D1 to D4. A protective resistor may be provided for the collector terminal or the base terminal of each of the first and second bipolar transistors Q1 and Q2. In this case, the stability of the circuit protection by the protection diodes D1 to D4 can be enhanced.

As the protective diode, a proper diode may be selected from a Schottky diode, a Zener diode, and the like on the basis of the relation between the breakdown voltage of a bipolar transistor to be protected and Zener voltage.

The operational amplifiers described in the embodiment include a general IC formed as a product as an operational amplifier and also a single general comparator formed as an IC. The present invention can be applied to a comparator by providing a protection diode for an input differential pair.

While the preferred embodiments of the present invention have been described using specific terms, such description is for illustrative purposes only, and it is to be understood that changes and variations may be made without departing from the spirit of scope of the appended claims.

The invention claimed is:

1. An operational amplifier comprising a protection diode whose cathode terminal is connected to a control terminal of at least one of transistors constructing an input differential pair connected to an inverting input terminal and a non-inverting input terminal and whose anode terminal is connected to a ground potential terminal, wherein
the transistors constructing the input differential pair are PNP-type bipolar transistors, and the size of the protection diode is set so that reverse current flowing from the cathode terminal to the anode terminal becomes substantially equal to the base current of the transistors.

2. An operational amplifier comprising a protection diode whose anode terminal is connected to a control terminal of at least one of transistors constructing an input differential air connected to an inverting input terminal and a non-inverting input terminal and whose cathode terminal is connected to a power supply voltage terminal, wherein
the transistors constructing the input differential pair are NPN-type bipolar transistors, and the size of the protection diode is set so that reverse current flowing from the cathode terminal to the anode terminal becomes substantially equal to the base current of the transistors.

3. The operational amplifier according to claim 1, wherein a plurality of protection diodes are connected in parallel.

4. The operational amplifier according to claim 1, wherein the operational amplifier is integrated, and the protection diode is provided adjacent to an electrode pad corresponding to the inverting input terminal or the non-inverting input terminal to which the protection diode is connected.

5. The operational amplifier according to claim 2, wherein a plurality of protection diodes are connected in parallel.

6. The operational amplifier according to claim 2, wherein the operational amplifier is integrated, and the protection diode is provided adjacent to an electrode pad corresponding to the inverting input terminal or the non-inverting input terminal to which the protection diode is connected.

* * * * *